US012765383B2

(12) United States Patent
Chang et al.

(10) Patent No.: US 12,765,383 B2
(45) Date of Patent: Oct. 13, 2026

(54) MULTI-CHIP INTEGRATED CIRCUIT DEVICES HAVING RECESSED REGIONS THEREIN THAT SUPPORT HIGH YIELD DICING

(71) Applicant: Samsung Electronics Co., Ltd., Suwon-si (KR)

(72) Inventors: Chulsoon Chang, Seongnam-si (KR); Seilyn Kwak, Goyang-si (KR); Haeseok Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 607 days.

(21) Appl. No.: 18/067,839

(22) Filed: Dec. 19, 2022

(65) Prior Publication Data

US 2023/0215818 A1 Jul. 6, 2023

(30) Foreign Application Priority Data

Dec. 31, 2021 (KR) ........................ 10-2021-0193813

(51) Int. Cl.

| | |
|---|---|
| ***H10W 42/00*** | (2026.01) |
| ***H10P 54/00*** | (2026.01) |
| ***H10W 72/00*** | (2026.01) |
| ***H10W 72/30*** | (2026.01) |
| ***H10W 72/50*** | (2026.01) |

(Continued)

(52) U.S. Cl.

CPC ........... *H10W 42/121* (2026.01); *H10P 54/00* (2026.01); *H10W 42/00* (2026.01); *H10W 72/30* (2026.01); *H10W 72/50* (2026.01); *H10W 72/851* (2026.01); *H10W 74/117* (2026.01);

(Continued)

(58) Field of Classification Search

CPC . H01L 2224/32225; H01L 2224/48227; H01L 2224/73265; H10P 54/00; H10W 46/503; H10W 42/00; H10W 42/121

See application file for complete search history.

(56) References Cited

U.S. PATENT DOCUMENTS

| | | | |
|---|---|---|---|
| 9,040,354 | B2 | 5/2015 | Mackh et al. |
| 9,105,531 | B2 | 8/2015 | Tomita |

(Continued)

FOREIGN PATENT DOCUMENTS

| | | | |
|---|---|---|---|
| KR | 100593157 | B1 | 6/2006 |
| KR | 10-2020-0032299 | A | 3/2020 |
| KR | 10-2021-0073178 | A | 6/2021 |

*Primary Examiner* — Jose R Diaz

(74) *Attorney, Agent, or Firm* — Wolf, Greenfield & Sacks, P.C.

(57) ABSTRACT

An integrated circuit device includes a semiconductor substrate having a first device region, a second device region, and a scribe line region therein. The scribe line region, which extends between the first and second device regions, includes a first edge region adjacent the first device region, a second edge region adjacent the second device region and a cutting region extending between the first and second device regions. A lower interlayer insulating layer is provided on the first and second device regions and on the scribe line region. A first multi-level guard ring is provided, which at least partially surrounds the first device region, when viewed from a plan perspective. An insulating structure is provided, which has a recess therein. The recess extends adjacent the first multi-level guard rings and exposes an upper surface of the lower interlayer insulating layer.

20 Claims, 17 Drawing Sheets

(51) Int. Cl.
*H10W 74/10* (2026.01)
*H10W 90/00* (2026.01)

(52) U.S. Cl.
CPC ........ *H10W 72/884* (2026.01); *H10W 90/734* (2026.01); *H10W 90/754* (2026.01)

(56) References Cited

U.S. PATENT DOCUMENTS

| | | | | |
|---|---|---|---|---|
| 9,559,063 | B2 | 1/2017 | Watanabe et al. | |
| 2009/0121321 | A1* | 5/2009 | Miccoli | H10W 46/00 257/E23.179 |
| 2018/0122751 | A1* | 5/2018 | Chen | H01L 23/5389 |
| 2020/0091100 | A1* | 3/2020 | Han | H01L 23/544 |
| 2020/0126927 | A1 | 4/2020 | Kim et al. | |
| 2021/0082809 | A1 | 3/2021 | Kim et al. | |

* cited by examiner

MULTI-CHIP INTEGRATED CIRCUIT DEVICES HAVING RECESSED REGIONS THEREIN THAT SUPPORT HIGH YIELD DICING

REFERENCE TO PRIORITY APPLICATION

This application claims priority to Korean Patent Application No. 10-2021-0193813, filed Dec. 31, 2021, the disclosure of which is hereby incorporated herein by reference.

BACKGROUND

Embodiments of the invention relate to integrated circuit devices and, more particularly, to multi-chip integrated circuit devices used in integrated circuit device fabrication and packaging.

Discrete semiconductor chips are typically fabricated by singulating a semiconductor substrate (e.g., semiconductor wafer) using a dicing process. Technologies for providing semiconductor chips having enhanced stability and reliability, while preventing failure during a dicing process are needed.

SUMMARY

Exemplary embodiments of the disclosure provide a multi-chip integrated substrate having a recessed region therein, which exposes an upper surface of a device layer.

A semiconductor chip according to an embodiment of the disclosure may include a semiconductor substrate including a device region and an edge region surrounding the device region. A device layer may be provided, which extends on the semiconductor substrate. The device layer may include a lower interlayer insulating layer covering the semiconductor substrate, an insulating structure including a lower insulating structure on the device layer and an upper insulating structure on the lower insulating structure. The lower insulating structure may include a plurality of lower insulating layers stacked on the lower interlayer insulating layer. A protective layer may be provided on the upper insulating structure, and a passivation layer may be provided on the protective layer. The insulating structure may include a first recessed region extending at an edge of the device layer (in the edge region), and exposing an upper surface of the lower interlayer insulating layer and side surfaces of the lower insulating layers. The upper insulating structure may include a second recessed region extending over the first recessed region and nearer to the device region than the first recessed region.

A semiconductor chip according to a further embodiment of the disclosure may include a semiconductor substrate having a device region and an edge region surrounding the device region. A device layer may be provided on the semiconductor substrate. The device layer includes a lower interlayer insulating layer covering the semiconductor substrate. An insulating structure is provided, which includes a lower insulating structure on the device layer and an upper insulating structure on the lower insulating structure. The lower insulating structure may include a plurality of lower insulating layers stacked on the lower interlayer insulating layer. A protective layer may be provided on the upper insulating structure, and a passivation layer may be provided on the protective layer. A crack prevention structure formed in an opening vertically extending through the insulating structure in the edge region. The insulating structure may include a first recessed region that extends at an edge of the device layer (in the edge region) and exposes an upper surface of the lower interlayer insulating layer and side surfaces of the lower insulating layers. The upper insulating structure may include a second recessed region disposed over the first recessed region and nearer to the device region relative to the first recessed region.

A semiconductor package according to another embodiment of the disclosure may include a package substrate including an upper pad and an outer connection terminal. The upper pad may extend at an upper surface of the package substrate, and the outer connecting terminal may extend at a lower surface of the package substrate. A semiconductor chip is provided on the package substrate, and a bonding wire is provided, which connects the semiconductor chip to the upper pad. An adhesive member is disposed between the package substrate and the semiconductor chip, and an encapsulant covers the package substrate and the semiconductor chip. The semiconductor chip may include a semiconductor substrate including a device region and an edge region surrounding the device region. A device layer extends on the semiconductor substrate. The device layer includes a lower interlayer insulating layer, which covers the semiconductor substrate. An insulating structure is provided, which includes a lower insulating structure on the device layer and an upper insulating structure on the lower insulating structure. The lower insulating structure includes lower insulating layers stacked on the lower interlayer insulating layer, and a protective layer on the upper insulating structure and a passivation layer on the protective layer. The insulating structure may include a first recessed region that extends at an edge of the device layer in the edge region and exposes an upper surface of the lower interlayer insulating layer and side surfaces of the lower insulating layers. The upper insulating structure may include a second recessed region, which extends over the first recessed region and extends nearer to the device region relative to the first recessed region.

According to a further embodiment of the disclosure, an integrated circuit device is provided, which includes a semiconductor substrate (e.g., wafer) including a first device region, a second device region, and a scribe line region extending between the first and second device regions. The scribe line region includes a first edge region adjacent the first device region, a second edge region adjacent the second device region and a cutting region extending between the first and second device regions. A lower interlayer insulating layer is provided on the first and second device regions and on the scribe line region. A first multi-level guard ring is provided, which at least partially surrounds the first device region, when viewed from a plan perspective. A second multi-level guard ring is provided, which at least partially surrounds the second device region, when viewed from the plan perspective. An insulating structure is provided, which has a recess therein. This recess extends between the first and second multi-level guard rings and exposes an upper surface of the lower interlayer insulating layer. For example, the recess may expose a portion of the upper surface of the lower interlayer insulating layer extending opposite the cutting region. The semiconductor substrate may also include a structurally-weakened region therein, which is aligned to the cutting region. The structurally-weakened region may be a laser-irradiated region.

According to still further embodiments of the disclosure, an integrated circuit device is provided, which includes a semiconductor wafer having a first device region, a second device region, and a scribe line region therein. The scribe line region extends between the first and second device regions, and includes first edge region adjacent the first device region, a second edge region adjacent the second device region and a cutting region extending between the first and second device regions. An insulating structure is also provided, which has a recess therein that is aligned to the cutting region. In some of these embodiments, the cutting region includes a structurally-weakened region therein, which enhances the reliability of mechanical dicing. The structurally-weakened region may be a laser-irradiated region.

DETAILED DESCRIPTION OF EXEMPLARY EMBODIMENTS

Figure 1:
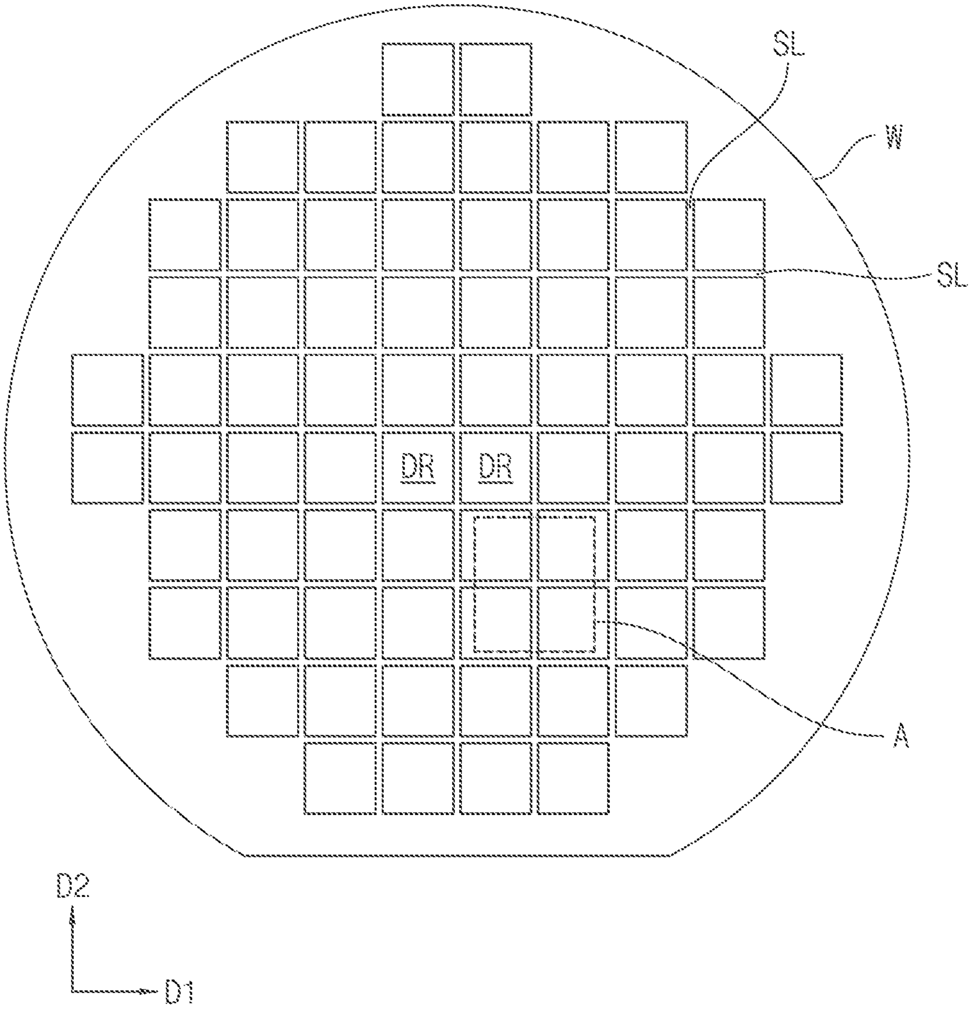
FIG. 1 is a plan view of a semiconductor substrate including a semiconductor chip according to an exemplary embodiment of the inventive concepts.

FIG. 1 is a plan view of a semiconductor substrate including a semiconductor chip according to an exemplary embodiment of the inventive concepts. Referring to FIG. 1, a semiconductor substrate W may include device regions DR, and scribe line regions SL among the device regions DR. As shown, the scribe line regions SL may extend in a first direction D1 and a second direction D2 (intersecting the first direction D1), such that a grid pattern is defined. The device regions DR may be arranged in the first direction D1 and the second direction D2, and may each be surrounded by the scribe line regions SL. Each device region DR may be singulated along the scribe line region SL using a dicing process, such that a semiconductor chip is formed. In the device region DR, an integrated circuit such as a memory cell array including switching devices and data storage elements, and logic devices including a MOSFET, a capacitor and a resistor may be disposed.

Figure 2:
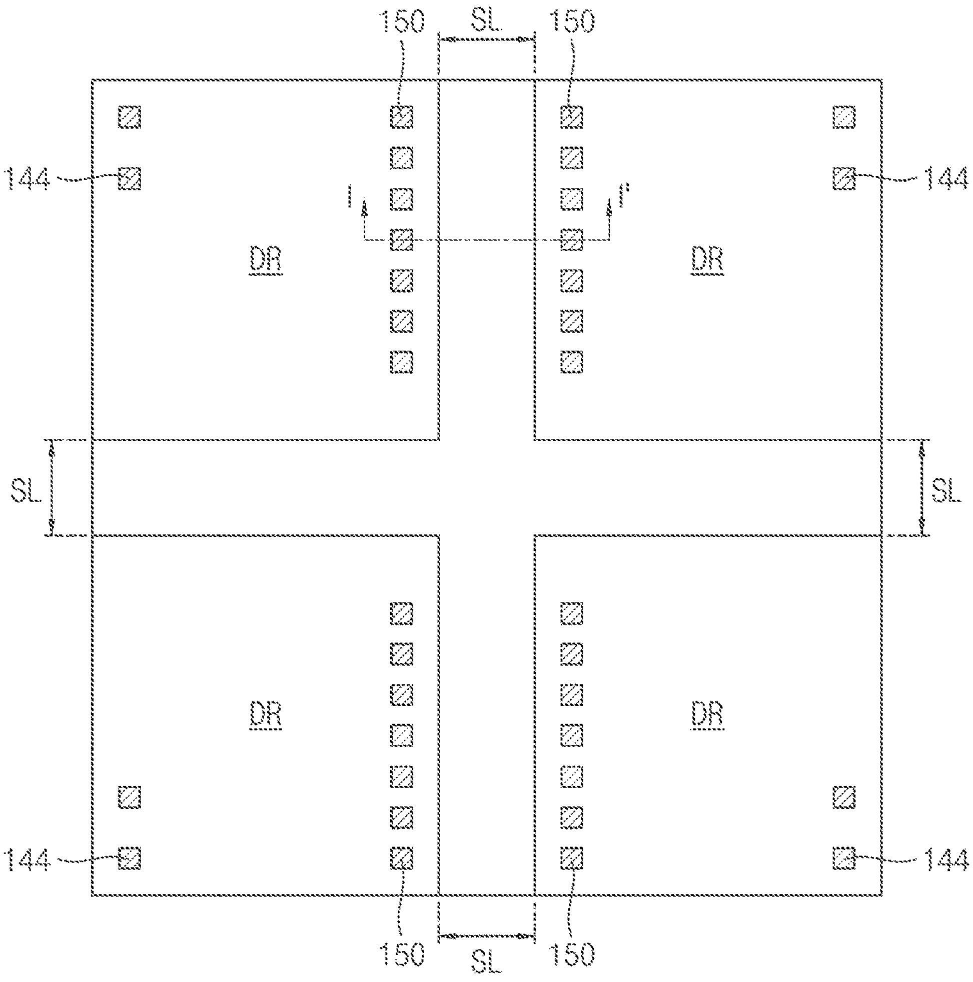
FIG. 2 is an enlarged view of highlighted region A shown in FIG. 1.

FIG. 2 is an enlarged view of a highlighted region A of FIG. 1. Referring to FIG. 2, a chip pad 144 and a connection pad 150 for input/output of data or a signal of the integrated circuit may be disposed in the device region DR. The chip pad 144 may be disposed at a generally central portion of the device region DR, and the connection pad 150 may be disposed at an edge of the device region DR. Although not shown, test device and alignment patterns for wafer-level evaluation of electrical characteristics of the integrated circuit may be disposed in the scribe line regions SL.

Figure 3:
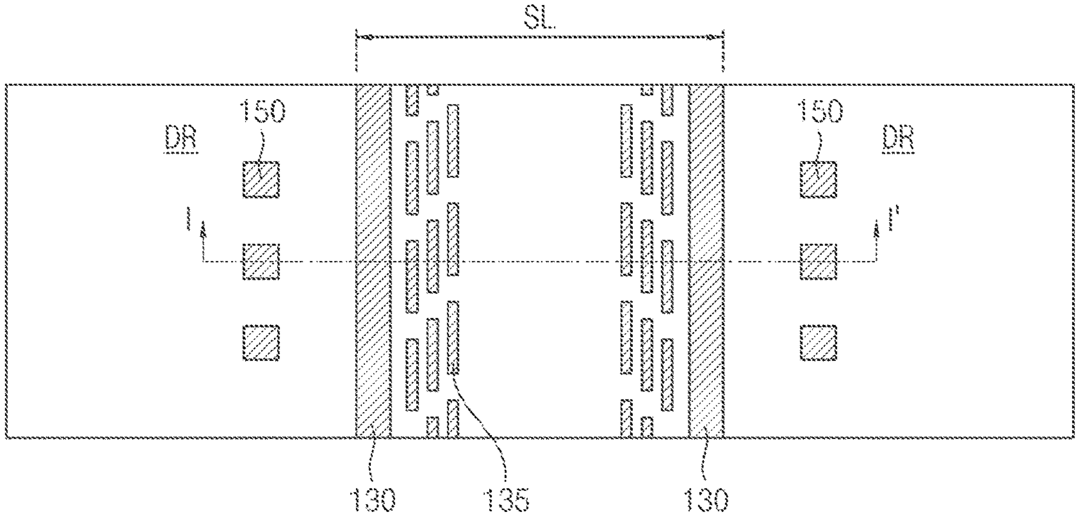
FIG. 3 is an enlarged view of a portion of the region of FIG. 2.

FIG. 3 is an enlarged view of FIG. 2. Referring to FIG. 3, a guard ring 130 and a dam structure 135 may be disposed in the scribe line region SL. The guard ring 130 may extend in a horizontal direction to surround the device region DR, and may be disposed between the dam structure 135 and the connection pad 150. Dam structures 135 may be disposed outside the guard ring 130 with reference to the device region DR. Advantageously, the dam structures 135 may reduce or prevent crack generation in each semiconductor chip in a dicing process which will be described later. The dam structures 135 may be disposed in parallel to the guard ring 130 while having a predetermined length. For example, the dam structures 135 may be spaced apart from one another in a direction parallel to an extension direction of the guard ring 130, and may be arranged in a column. In an embodiment, the dam structures 135 may be arranged into a plurality of columns.

Figure 4:
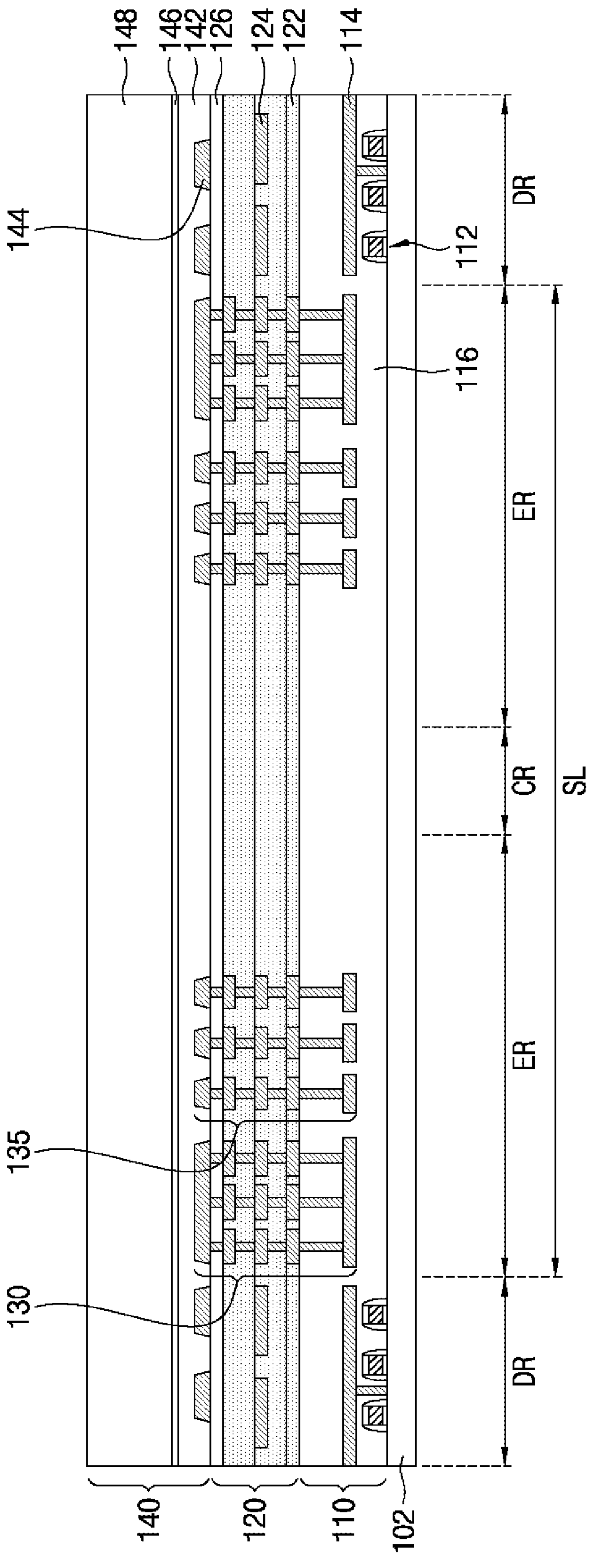
FIGS. 4 to 11 are cross-sectional views of intermediate structures that illustrate methods of fabricating semiconductor chips according to exemplary embodiments of the inventive concepts.

FIGS. 4 to 11 are cross-sectional views illustrating in process order of a method of manufacturing a semiconductor chip according to an exemplary embodiment of the inventive concepts. Referring to FIG. 4, a device layer 110, a lower insulting structure 120, and an upper insulting structure 140 may be formed on a semiconductor substrate 102. In the specification, the lower insulating structure 120 and the upper insulating structure 140 may be collectively referred to as an “insulating structure”. The semiconductor substrate 102 may correspond to the semiconductor substrate W (e.g., wafer) shown in FIG. 1.

The semiconductor substrate 102 may include device regions DR, and scribe line regions SL among the device regions DR. The scribe line regions SL may include edge regions ER, and a cutting region CR among the edge regions ER. The edge region ER may surround the device region DR. The cutting region CR may represent a portion to be separated in a dicing process which will be described later. The semiconductor substrate 102 may include a semiconductor material. For example, the semiconductor substrate 102 may be a silicon substrate, a germanium substrate, a silicon germanium substrate, or a silicon-on-insulator (SOI) substrate.

The device layer 110 may include devices 112, wirings 114, and a lower interlayer insulating layer 116. The devices 112 may include a memory cell array including switching devices and data storage elements, and logic devices including a MOSFET, a capacitor and a resistor. The wiring 114 may be disposed on the devices 112, and may be electrically connected to at least one of the devices 112. The devices 112 and the wiring 114 may be disposed in the device region DR. The lower interlayer insulating layer 116 may cover the semiconductor substrate 102, the devices 112, and the wirings 114. The wirings 114 may include copper (Cu), aluminum (Al), tungsten (W), nickel (Ni), titanium (Ti), titanium nitride (TiN), tantalum (Ta), tantalum nitride (TaN), gold (Au), or a combination thereof. The lower interlayer insulating layer 116 may include silicon oxide, silicon nitride, silicon oxynitride, or a combination thereof. For example, the lower interlayer insulating layer 116 may include silicon oxide.

The lower insulating structure 120 may be formed on the device layer 110. The lower insulating structure 120 may include lower insulating layers 122 and an upper interlayer insulating layer 126. The lower insulating layers 122 may be deposited on the lower interlayer insulating layer 116. The upper interlayer insulating layer 126 may be disposed on an uppermost one of the lower insulating layers 122. Lower wirings 124 may be buried in the lower insulating layers 122, and may be disposed in the device region DR.

The lower insulating layer 122 and the upper interlayer insulating layer 126 may include low-k dielectrics having a low dielectric constant. For example, the lower insulating layer 122 may include silicon oxide doped with an impurity or an organic polymer. In an embodiment, the lower insulating layer 122 may include SiOCH, SiCN, or a combination thereof. The upper interlayer insulating layer 126 may include silicon oxide.

The upper insulating structure 140 and a chip pad 144 may be formed on the lower insulating structure 120. The chip pad 144 may be formed by forming a conductive material on the upper interlayer insulating layer 126, and then patterning the conductive material. The chip pad 144 may be disposed in the device region DR, and may be electrically connected to the lower wiring 124. The chip pad 144 may include copper (Cu), aluminum (Al), tungsten (W), nickel (Ni), titanium (Ti), titanium nitride (TiN), tantalum (Ta), tantalum nitride (TaN), gold (Au), or a combination thereof. For example, the chip pad 144 may include aluminum (Al).

The upper insulating structure 140 may include a first upper insulating layer 142, a second upper insulating layer 146, and a third upper insulating layer 148 which are sequentially stacked. The first upper insulating layer 142 may cover the chip pad 144, and the second upper insulating layer 146 may cover the first upper insulating layer 142. Although the second upper insulating layer 146 is shown as being flat, the exemplary embodiments of the disclosure are not limited thereto. In an embodiment, a portion of the second upper insulating layer 146 corresponding to the chip pad 144 may protrude upwards. The second upper insulating layer 146 may include a material having etch selectivity with respect to the first upper insulating layer 142. For example, the first upper insulating layer 142 may include high-density plasma (HDP) oxide, and the second upper insulating layer 146 may include silicon nitride. In an embodiment, the third upper insulating layer 148 may include silicon oxide. For example, the third upper insulating layer 148 may include tetraethylorthosilicate (TEOS), and operate as a passivation layer.

In addition, a guard ring 130 and a dam structure 135 may be formed in the edge region ER. As shown in FIG. 3, the guard ring 130 may extend in a horizontal direction to surround the device region DR. In cross-sectional view, the guard ring 130 may extend through the lower insulating layer 120, and may extend into a portion of the first upper insulating layer 142 and a portion of the lower interlayer insulating layer 116. The guard ring 130 may include metal patterns constituted by a plurality of layers, and a multi-tier via vertically interconnecting the metal patterns. The metal patterns may be formed together with the wiring 114, the lower wiring 124 and the chip pad 144. The guard ring 130 may prevent crack generation in the semiconductor chip.

The dam structure 135 may be disposed nearer to the cutting region CR than the guard ring 130. As shown in FIG. 3, dam structures 135 may be spaced apart from one another, and may be arranged into a plurality of columns. In a cross-sectional view, the dam structure 135 may extend through the lower insulating layer 120, and may extend into a portion of the first upper insulating layer 142 and a portion of the lower interlayer insulating layer 116. The dam structure 135 may include metal patterns constituted by a plurality of layers, and a multi-tier via vertically interconnecting the metal patterns. In an embodiment, the dam structure 135 may be formed together with the guard ring 130. The dam structure 135 may prevent crack generation in the semiconductor chip. The guard ring 130 and the dam structures 135 may include copper (Cu), aluminum (Al), tungsten (W), nickel (Ni), titanium (Ti), titanium nitride (TiN), tantalum (Ta), tantalum nitride (TaN), gold (Au), or a combination thereof.

Figure 5:
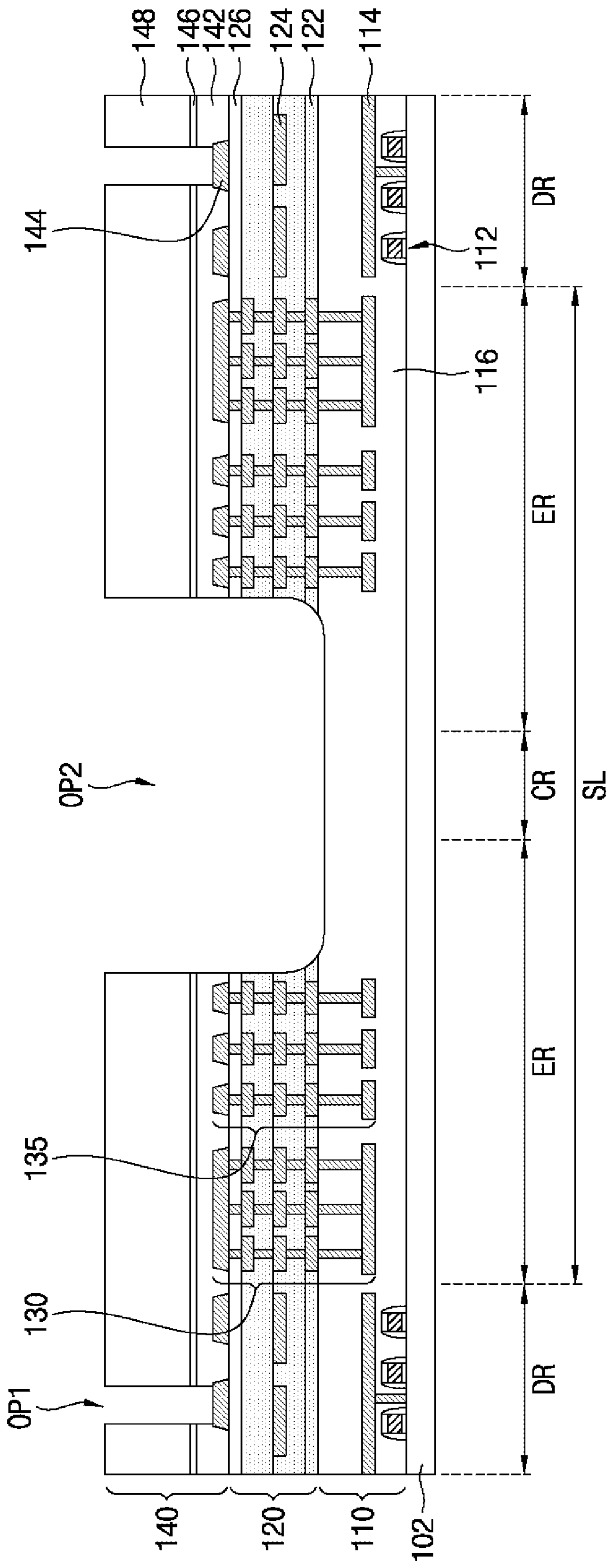

Referring to FIG. 5, an etching process for etching the lower insulating structure 120 and the upper insulating structure 140 may be performed. For example, using an etching process, a first opening OP1 and a second opening OP2 may be formed. First openings OP1 may be disposed in the device region DR, and may extend through the first upper insulating layer 142, the second upper insulating layer 146, and the third upper insulating layer 148. The first openings OP1 may expose upper surfaces of chip pads 144.

The second opening OP2 may be disposed in the scribe line region SL and, for example, may be disposed to extend over a portion of the edge region ER and may be wider than the cutting region CR, as shown. The second opening OP2 may extend along the scribe line region SL to surround the device region DR. The second opening OP2 may extend through the lower insulating structure 120 and the upper insulating structure 140, and may expose a side surface of the lower insulating structure 120 and a side surface of the upper insulating structure 140. The lower insulating structure 120 may be completely cut (i.e., etched) and, as such, an upper surface of the device layer 110 may be exposed. For example, the second opening OP2 may expose an upper surface of the lower interlayer insulating layer 116. In cross-sectional view, a lower portion of the second opening OP2 may be rounded. For example, a side surface of a lower portion of the lower insulating structure 120 exposed by the second opening OP2 may be rounded. In an embodiment, the exposed upper surface of the lower interlayer insulating layer 116 may be disposed at a lower level than a lower surface of the lower insulating structure 120.

In some embodiments, the first openings OP1 and the second opening OP2 may be simultaneously formed. For example, a hard mask, and a photoresist on the hard mask may be formed on the resultant structure of FIG. 4. The photoresist may be patterned by an exposure process. The exposure process may be performed by irradiating the photoresist with electron beams or light. In an embodiment, the amount of electron beams or light respectively irradiating a portion of the photoresist corresponding to the first opening OP1 and a portion of the photoresist corresponding to the second opening OP2 may be different from each other. For example, the exposure process may be performed such that the scribe line region SL is irradiated with a greater amount of electron beams or light. The photoresist may be etched by the exposure process, thereby forming an etch pattern, and etched amounts of the photoresist in the device region DR and the scribe line region SL may be different from each other. For example, as shown, the etch pattern in the scribe line region SL may be wider than the etch pattern in the device region DR. Thereafter, the hard mask may be etched using the photoresist as an etch mask, and the first opening OP1 and the second opening OP2 may be formed by an etching process using the etched hard mask as an etch mask. Accordingly, the second opening OP2 may be formed to be deeper and wider than the first opening OP1. For example, the second opening OP2 may completely extend through the lower insulating structure 120 and the upper insulating structure 140 in the cutting region CR and a portion of the edge region ER and, as such, may expose the lower interlayer insulating layer 116. Alternatively, in another embodiment, a plurality of etching processes may be performed for the resultant structure of FIG. 4 and, as such, the first opening OP1 and the second opening OP2 may be formed by different etching processes, respectively.

Figure 6:
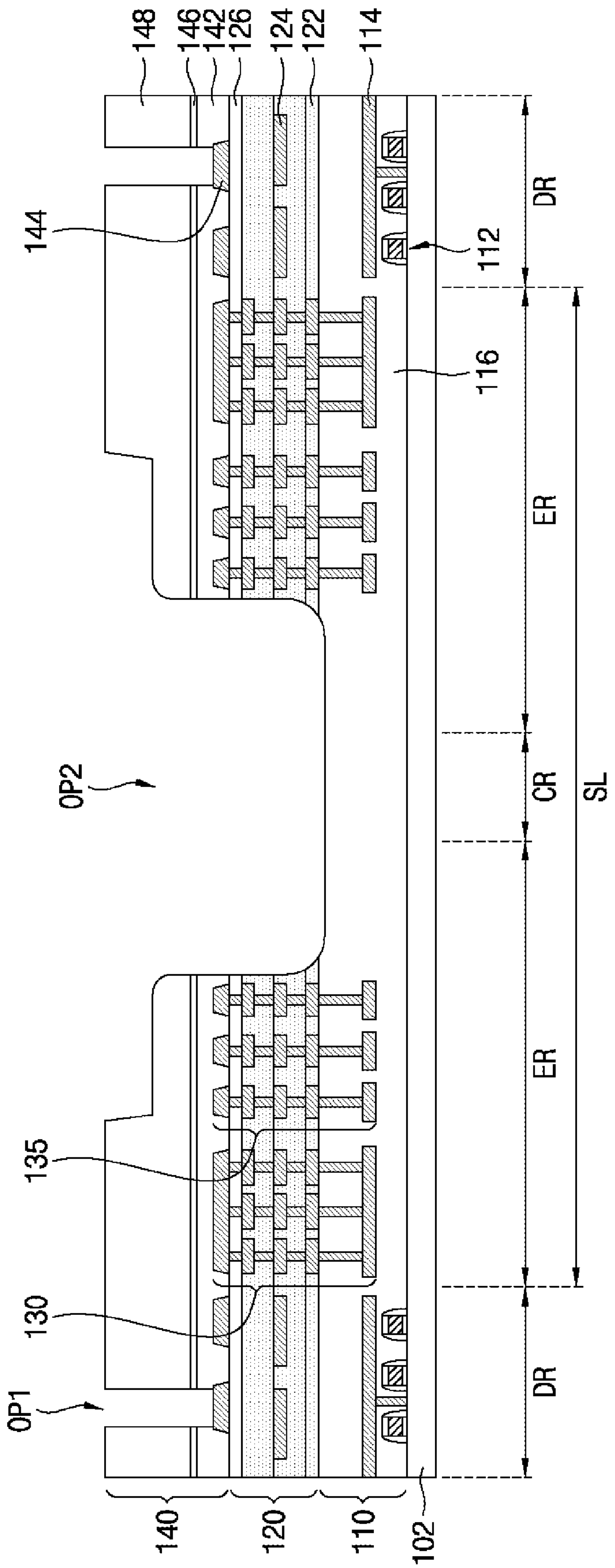

Referring now to FIG. 6, an etching process for partially etching an upper portion of the third upper insulating layer 148 may further be performed. Using the etching process, an upper portion of the second opening OP2 may become wider in the horizontal direction. A portion of the third upper insulating layer 148 adjacent to the second opening OP2 may be etched and, as such, the third upper insulating layer 148 may have a step shape, as shown. In some embodiments, a lower portion of the second opening OP2 may be further etched by the etching process and, as such, the exposed upper surface of the lower interlayer insulating layer 116 may be further lowered.

Figure 7:
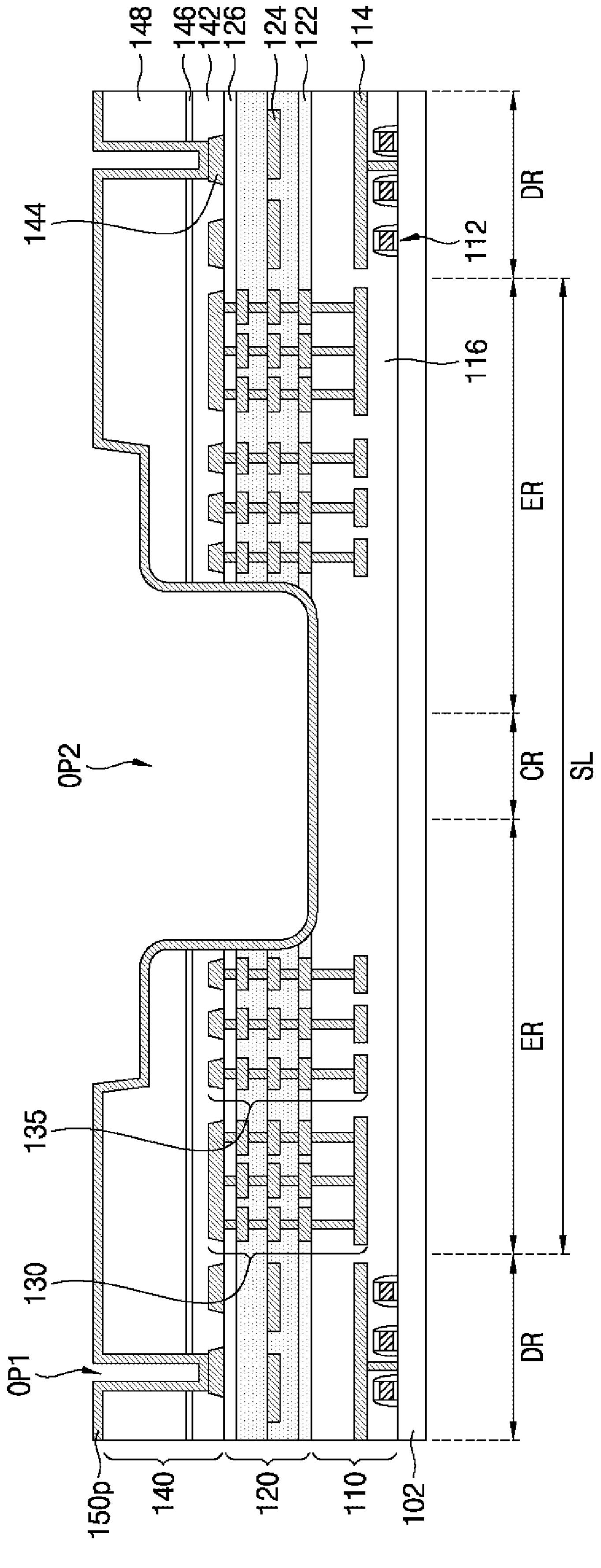

Referring now to FIG. 7, a conductive material 150*p* may be conformally deposited on the resultant structure of FIG. 6. As shown, the conductive material 150*p* may cover an upper surface of the third upper insulating layer 148, an inner wall of the first opening OP1, and an inner wall of the second opening OP2. The conductive material 150*p* may include at least one of copper (Cu), aluminum (Al), tungsten (W), nickel (Ni), titanium (Ti), titanium nitride (TiN), tantalum (Ta), tantalum nitride (TaN), gold (Au), or a combination thereof. For example, the conductive material 150*p* may include aluminum (Al) in some embodiments.

Figure 8:
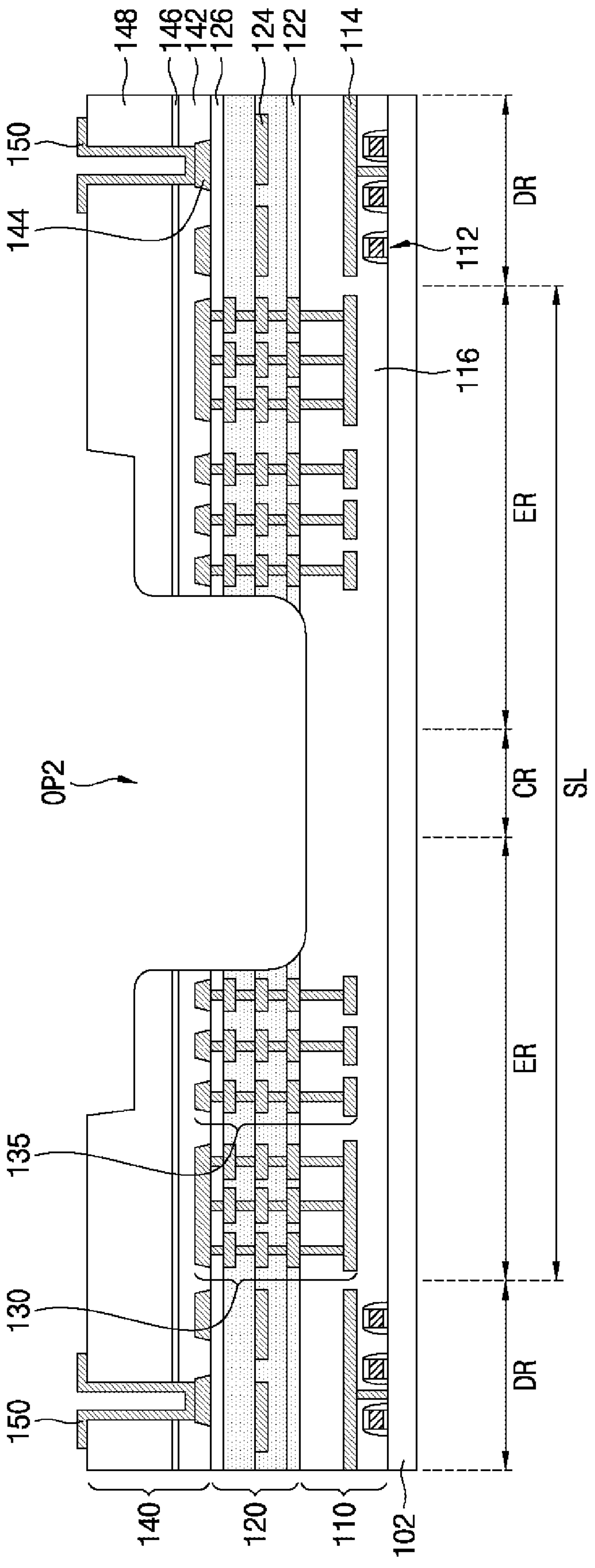

Referring to FIG. 8, the conductive material 150*p* may be patterned, thereby forming a connection pad 150. The connection pad 150 may cover an upper surface of the third upper insulating layer 148, the inner wall of the first opening OP1, and an upper surface of the chip pad 144. Advantageously, because the lower portion of the second opening OP2 is formed to be rounded, as shown in FIG. 5, the conductive material 150*p* may be completely removed in the patterning process without remaining in the second opening OP2. Accordingly, it may be possible to reduce damage to the semiconductor chip and an electrical short circuit of the semiconductor chip caused by a residue of the conductive material 150*p* in the second opening OP2.

Figure 9:
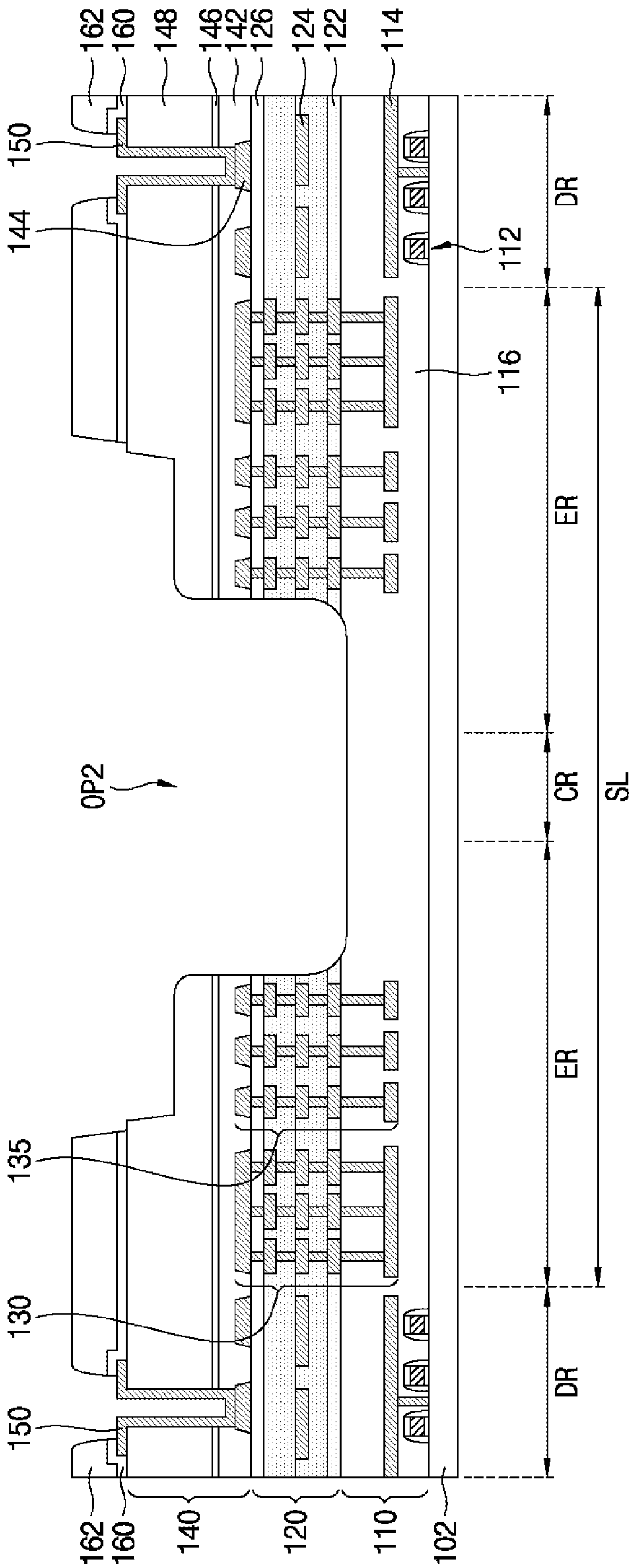

Referring to FIG. 9, a protective layer 160 and a passivation layer 162 may be formed. The protective layer 160 and the passivation layer 162 may be formed by depositing an insulating material layer on the resultant structure of FIG. 8, and etching the insulating material layer such that the first opening OP1 and the second opening OP2 are exposed. The protective layer 160 may partially cover the upper surface of the third upper insulating layer 148 and an upper surface of the connection pad 150. The passivation layer 162 may cover the protective layer 160. The protective layer 160 and the passivation layer 162 may be disposed in the device region DR and the edge region ER, but may not cover the second opening OP2. The protective layer 160 may include silicon nitride, and the passivation layer 162 may include a polyimide-group material such as photosensitive polyimide (PSPI).

Figure 10:
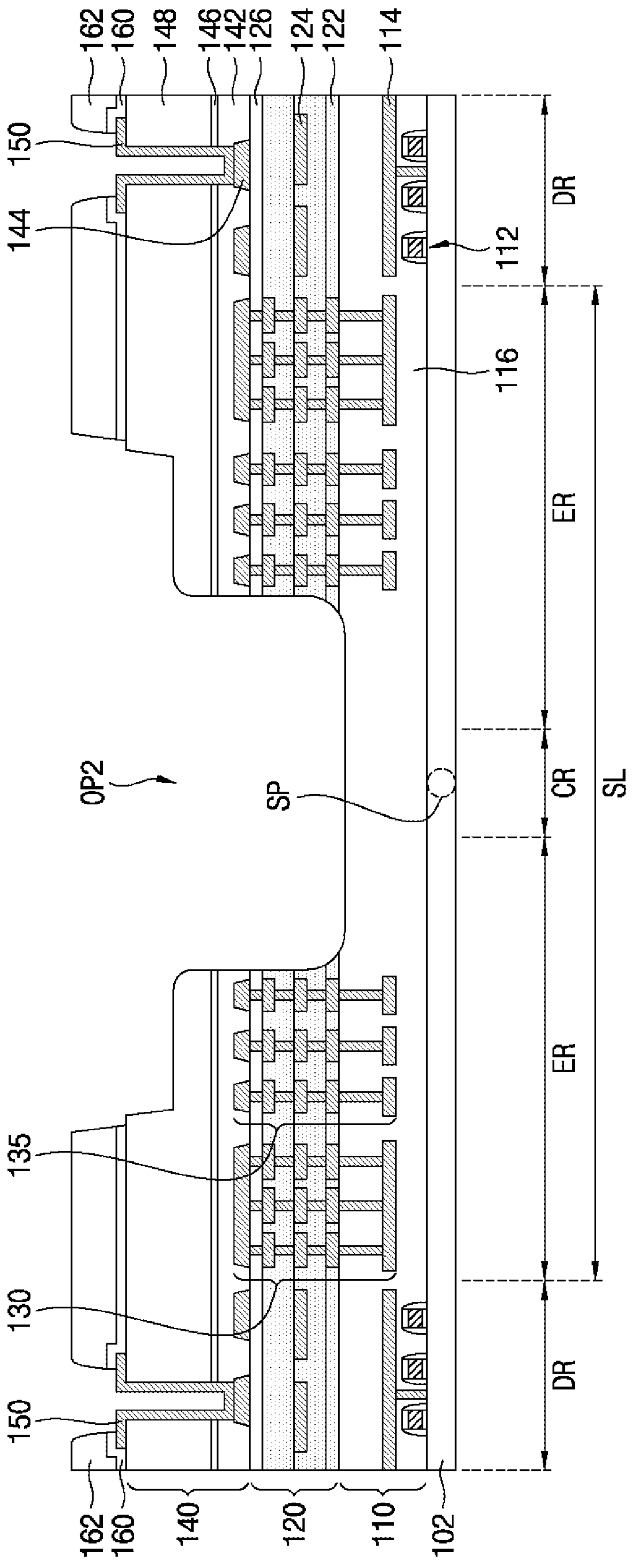

Referring to FIG. 10, a back surface of the semiconductor substrate 102 may be irradiated with a laser. For example, a thin film tape (not shown) may be attached to the semiconductor substrate 102, and a portion of the semiconductor substrate 102 in the cutting region CR may be irradiated with a laser. Advantageously, the physical characteristics of the semiconductor substrate 102 may be varied at a laser spot SP irradiated with the laser. For example, in response to the irradiation, a physical strength of the semiconductor substrate 102 may be lowered in order to facilitate cutting (e.g., singulation).

Figure 11:
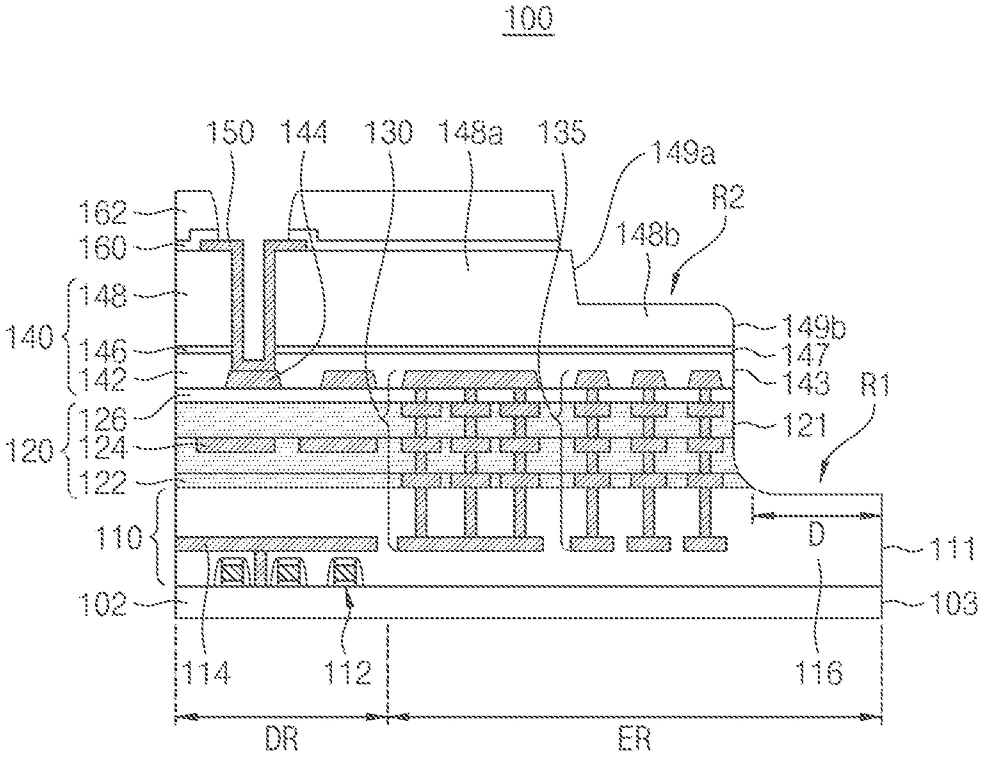

Referring to FIG. 11, the semiconductor substrate 102 may be singulated by the dicing process, thereby forming a semiconductor chip 100. For example, the thin film tape attached to the semiconductor substrate 102 may be stretched in the horizontal direction and, as such, the semiconductor substrate 102 may be singulated along the cutting region CR. Alternatively, in some embodiments, the dicing process may be a process for cutting the semiconductor substrate 102 using a sawing wheel. As shown in FIG. 10, the lower insulating structure 120 is not present in the cutting region CR, which means that the lower interlayer insulating layer 116 of the device layer 110 (but not the lower insulating structure 120) and the substrate 102 must be is separated in the dicing process. That is, the lower insulating structure 120, which may be relatively weak against cracking, need not be separated in the dicing process. Accordingly, crack generation in the semiconductor chip 100 may be reduced or prevented.

The semiconductor chip 100 may include a device region DR and an edge region ER. In the device region DR, devices, a lower wiring 124, a chip pad 144, and a connection pad 150 may be provided, however, in the edge region ER, a guard ring 130 and a dam structure 135 may be provided. In addition, the semiconductor chip 100 may include a first recessed region R1 and a second recessed region R2 in the edge region ER. The first recessed region R1 may be disposed at an edge of a device layer 110 in the edge region ER. For example, the first recessed region R1 may extend from a side surface 111 of the device layer 110 toward the device region DR. As shown in FIG. 5, the first recessed region R1 may correspond to a portion of a second opening OP2, and may be formed by etching a lower insulating structure 120 and an upper insulating layer 140. The first recessed region R1 may expose an upper surface of the device layer 110 and side surfaces 121 of lower insulating layers 122. In an embodiment, an upper surface of the lower interlayer insulating layer 116 exposed by the first recessed region R1 may be provided at a lower level than a lower surface of the lower insulating structure 120. For example, the upper surface of the lower interlayer insulating layer 116 exposed by the first recessed region R1 may be provided at a lower level than a lower surface of a lowermost one of the lower insulating layers 122. The horizontal length of the exposed upper surface of the device layer 110 may be in a range from about 15 μm to about 17 μm in some embodiments.

The second recessed region R2 may further extend from an upper portion of the first recessed region R1 toward the device region DR. The second recessed region R2 may be disposed above the first recessed region R1, and may be nearer to the device region DR than the first recessed region R1. The second recessed region R2 may be formed by partially etching the upper insulating structure 140. For example, the second recessed region R2 may be formed by partially etching a third upper insulating layer 148, as shown in FIG. 6. The third upper insulating layer 148 may include a first portion 148*a* covered by a protective layer 160 and a passivation layer 162, and a second portion 148*b* connected to the first portion 148*a* and exposed by the second recessed region R2. In some embodiments, the thickness of the second portion 148*b* may be smaller than the thickness of the first portion 148*a*. For example, an upper surface of the second portion 148*b* may be exposed by the second recessed region R2, and may be disposed at a lower level than an upper surface of the first portion 148*a*. In an embodiment, a step may be formed between the first portion 148*a* and the second portion 148*b*. The third upper insulating layer 148 may include a first side surface 149*a* and a second side surface 149*b*. The first side surface 149*a* of the third upper insulating layer 148 (or the first portion 148*a*) may be exposed by the second recessed region R2, and may interconnect the upper surface 148*a* and the upper surface of the second portion 148*b*. The second side surface 149*b* of the third upper insulating layer 148 (or the second portion 148*b*) may be exposed by the first recessed region R1. The first side surface 149*a* may be misaligned from the second side surface 149*b*, and may be nearer to the device region DR than the second side surface 149*b*.

Side surfaces 121, 143 and 147 of the lower insulating structure 120 and the upper insulating structure 140 may be misaligned from the side surface 111 of the device layer 110, and may be nearer to the device region DR than the side surface 111 of the device layer 110. For example, the second side surface 149*b* of the second portion 148*b*, the side surface 147 of the second upper insulating layer 146, the side surface 143 of the first upper insulating layer 142 and the side surface 121 of the lower insulating structure 120, which are exposed by the first recessed region R1, may be coplanar, and may be nearer to the device region DR than the side surface 111 of the device layer 110. For example, the horizontal lengths of the lower insulating structure 120 and the upper insulating structure 140 may be smaller than the horizontal length of the semiconductor substrate 102. The horizontal length of the first portion 148*a* of the third upper insulating layer 148 may be smaller than the horizontal length of the second portion 148*b* of the third upper insulating layer 148. In an embodiment, a side surface of a lower portion of the lower insulating structure 120 may be rounded. For example, a side surface of the lowermost one of the lower insulating layers 122 may be rounded, however, other shapes may also be possible according to alternative embodiments.

Figure 12:
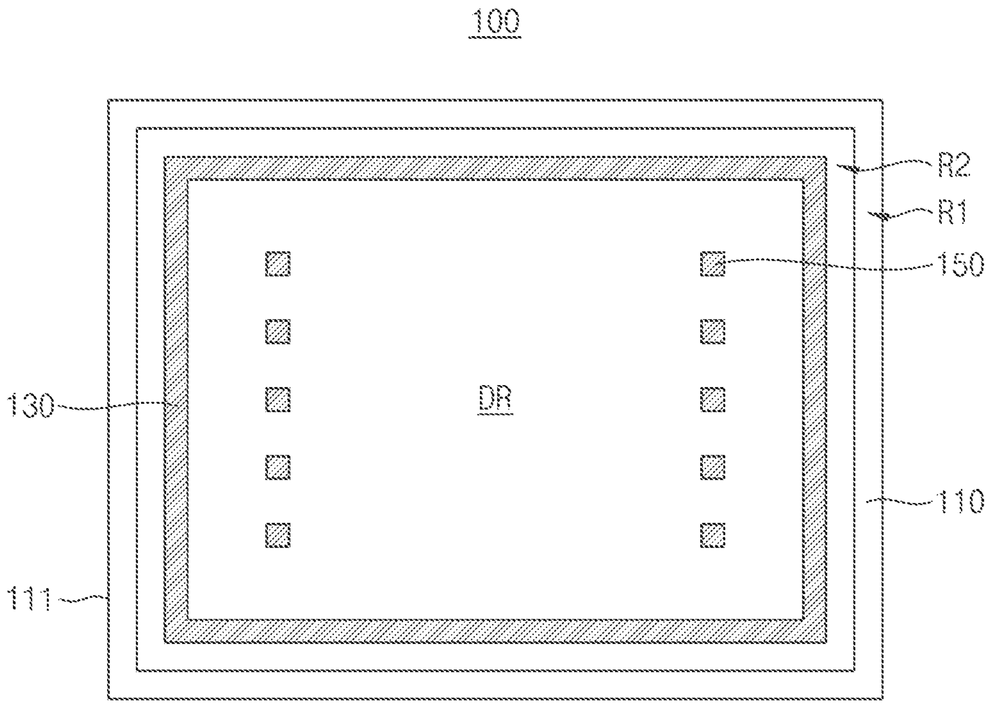
FIG. 12 is a plan view of a semiconductor chip according to an exemplary embodiment of the inventive concepts.

FIG. 12 is a plan view of a semiconductor chip according to an exemplary embodiment of the inventive concepts. Referring to FIG. 12, a guard ring 130 disposed in an edge region ER may extend in a horizontal direction to surround a device region DR. Although the guard ring 130 is shown as being quadrangular (e.g., rectangular) in plan view, the exemplary embodiments of the disclosure are not limited thereto. In some embodiments, the guard ring 130 may be circular or oval. A second recessed region R2 may be disposed outside the guard ring 130, and may surround the guard ring 130. Although not shown, a dam structure 135 may overlap with the second recessed region R2. A first recessed region R1 may extend along a side surface of a substrate, and may surround the second recessed region R2. In some embodiments, the first recessed region R1 and the second recessed region R2 may not be formed at an alignment pattern disposed at an outside of a semiconductor chip 100.

Figure 13:
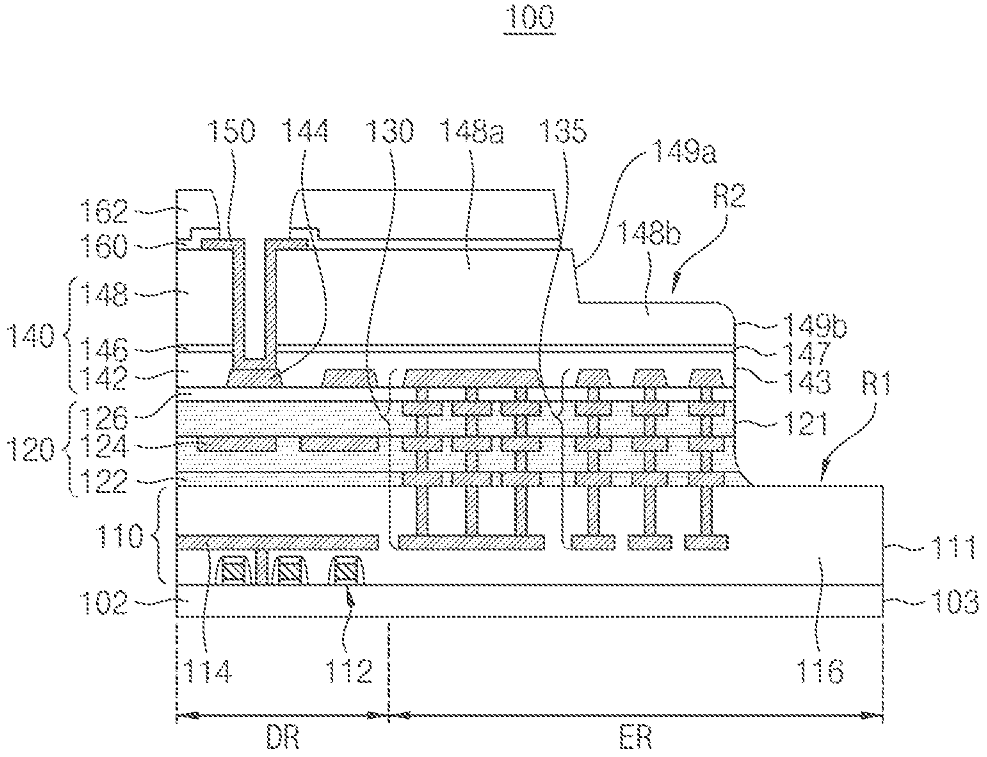
FIG. 13 is a cross-sectional view of a portion of a semiconductor chip according to an exemplary embodiment of the inventive concepts.

FIG. 13 is a cross-sectional view of a semiconductor chip according to an exemplary embodiment of the inventive concepts. A semiconductor chip 100 of FIG. 13 may have a similar structure as the semiconductor chip 100 shown in FIG. 11. However, in the embodiment of FIG. 13, an upper surface of the lower interlayer insulating layer 116 exposed by a first recessed region R1 may be coplanar with a lower surface of a lower insulating structure 120. For example, the upper surface of the lower interlayer insulating layer 116 exposed by the first recessed region R1 may be coplanar with a lower surface of a lowermost lower insulating layer 122.

Figure 14:
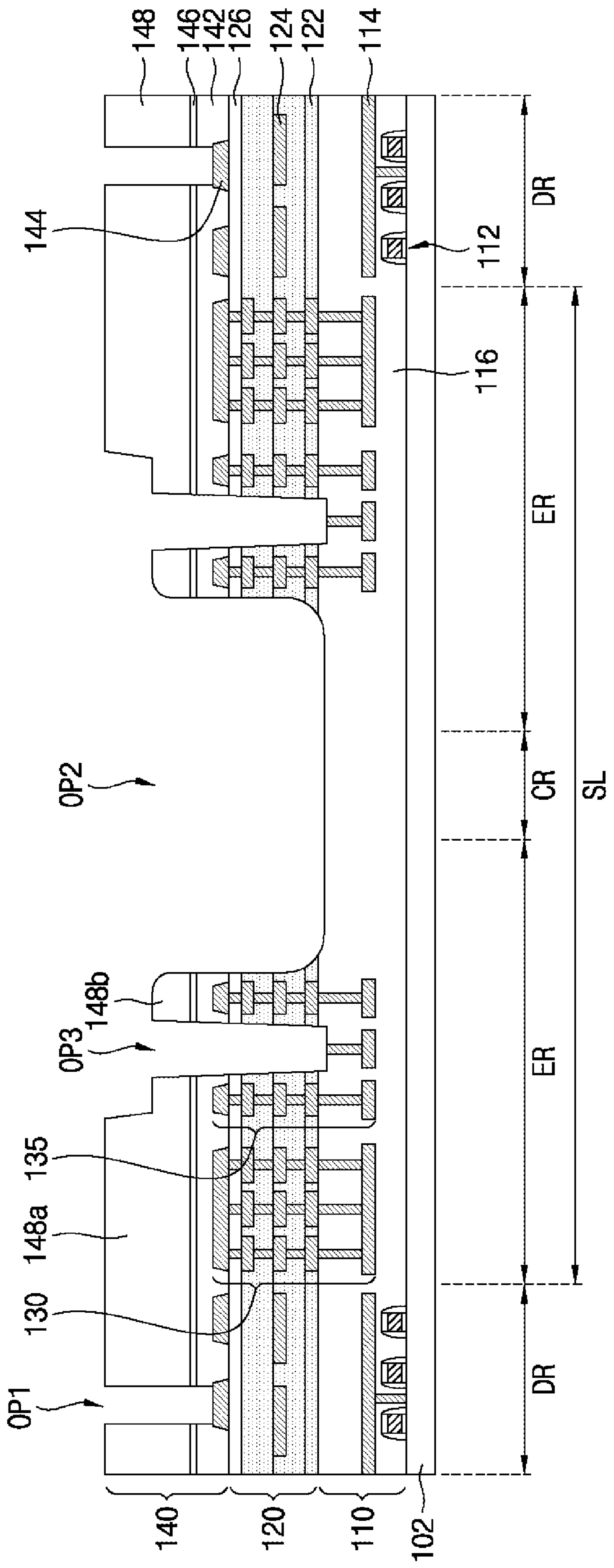
FIGS. 14 to 19 are cross-sectional and plan views of intermediate structures that illustrate methods of fabricating semiconductor chips according to exemplary embodiments of the inventive concepts.

FIGS. 14 to 19 are cross-sectional views and plan views illustrating in process order of a method of manufacturing a semiconductor chip according to an exemplary embodiment of the inventive concepts. Referring to FIG. 14, a third opening OP3 may be formed in the etching process described with reference to FIG. 6. The third opening OP3 may be formed through an upper insulating structure 140 and a lower insulating structure 120, and may overlap with at least one of dam structures 135. The third opening OP3 may be formed at a second portion 148*b* of a third upper insulating layer 148, and may overlap with a second opening OP2. Of course, the exemplary embodiments of the disclosure are not limited to the above-described structure and, in some embodiments, the third opening OP3 may be formed at a first portion 148*a* of the third upper insulating layer 148 and may not overlap with the second opening OP2. The third opening OP3 may also extend into a portion of a lower interlayer insulating layer 116 through an upper surface of the lower interlayer insulating layer 116.

Figure 15:
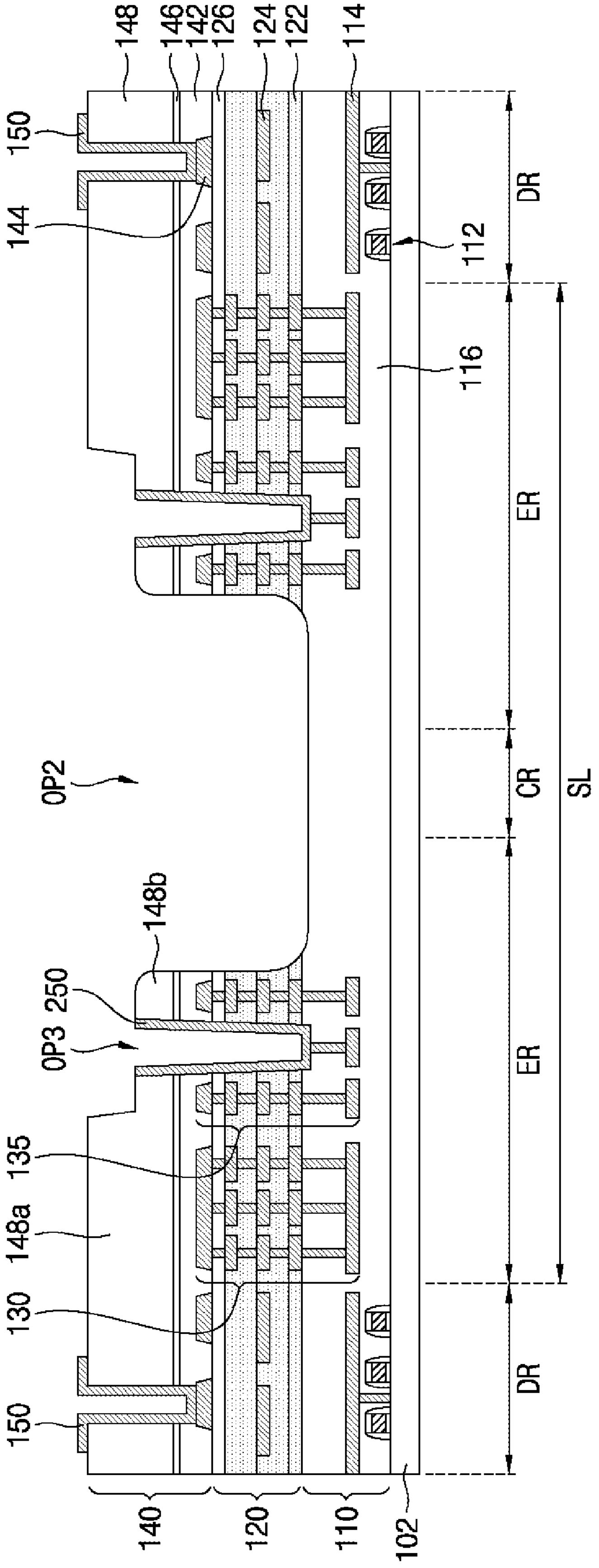

Referring to FIG. 15, a connection pad 150 and a first material layer 250 may be formed. The connection pad 150 may be formed by the process described with reference to FIGS. 7 and 8. The first material layer 250 may be formed at an inner wall of the third opening OP3. For example, the first material layer 250 may cover portions of the lower insulating structure 120, the upper insulating structure 140 and the lower interlayer insulating layer 116 exposed by the third opening OP3.

In an embodiment, the first material layer 250 may be formed together with the connection pad 150. For example, the connection pad 150 and the first material layer 250 may be formed by depositing a conductive material on the resultant structure of FIG. 14, and patterning the conductive material. The first material layer 250 may be the conductive material remaining at the inner wall of the third opening OP3 without being removed in the patterning process. Although an upper end of the first material layer 250 is shown as being coplanar with an upper surface of the second portion 148*b* of the third upper insulating layer 148, the exemplary embodiments of the disclosure are not limited thereto. In some embodiments, the upper end of the first material layer 250 may be disposed at a lower level than the upper surface of the second portion 148*b* of the third upper insulating layer 148. In some embodiments, the first material layer 250 may be formed in a process separate from that of the connection pad 150.

Figure 16:
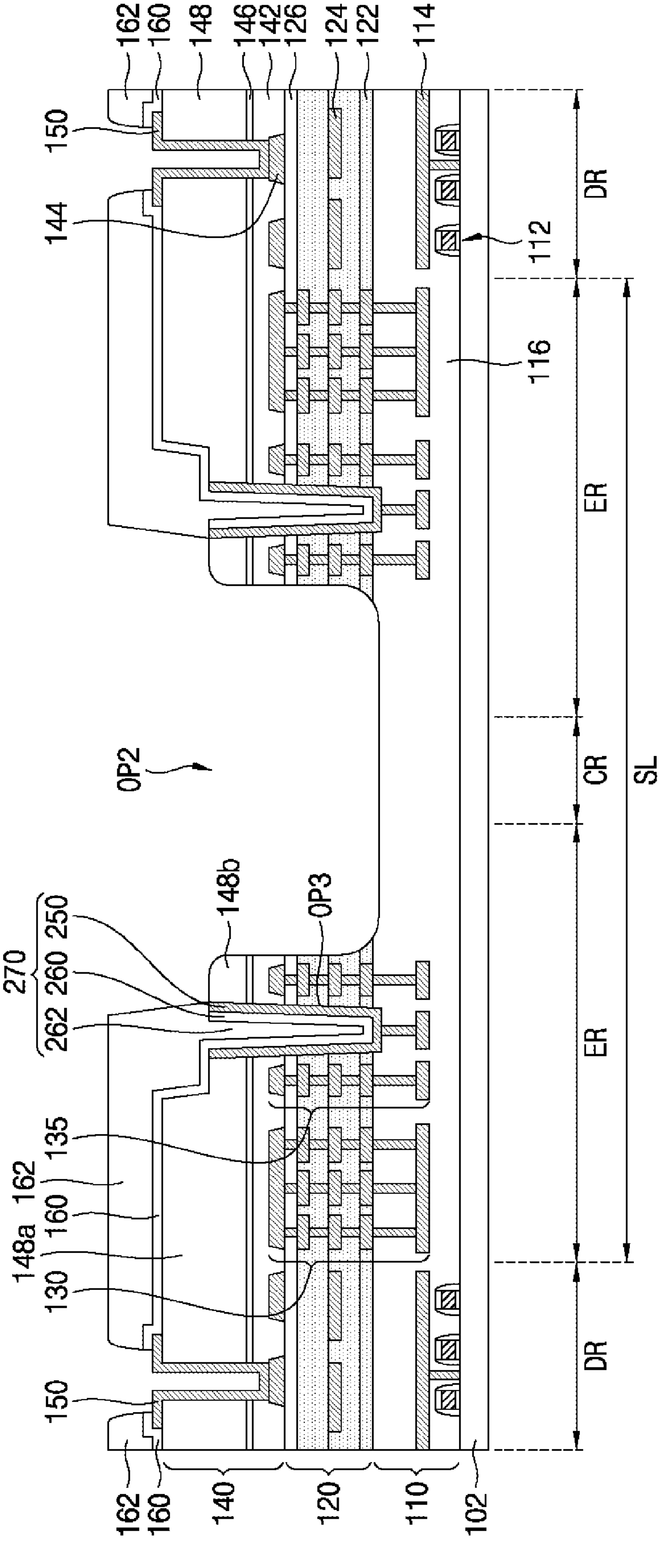

Referring to FIG. 16, a protective layer 160, a passivation layer 162, a second material layer 260, and a third material layer 262 may be formed. The first material layer 250, the second material layer 260 and the third material layer 262, which are formed in the third opening OP3, may collectively define an efficient crack prevention structure 270. The crack prevention structure 270 may extend through the lower insulating structure 120 and the upper insulating structure 140 and, for example, may extend through the second portion 148*b* of the third upper insulating layer 148, as shown.

The protective layer 160 and the passivation layer 162 may be formed by the process described with reference to FIG. 8. The second material layer 260 may cover the first material layer 250, and the third material layer 262 may cover the second material layer 260 and may fill the third opening OP3. In an embodiment, the second material layer 260 and the third material layer 262 may be formed together with the protective layer 160 and the passivation layer 162, respectively. For example, the protective layer 160, the passivation layer 162, the second material layer 260 and the third material layer 262 may be formed by depositing an insulating material on the resultant structure of FIG. 15, and etching the insulating material. The second material layer 260 and the third material layer 262 may be the insulating material remaining on the first material layer 250 that was not removed in the etching process. In an embodiment, the second material layer 260 may include the same material as the protective layer 160, and may be formed to be integrated with the protective layer 160. For example, the protective layer 160 may extend from an upper surface of the third upper insulating layer 148 and, as such, may be connected to the second material layer 260. In an embodiment, the third material layer 262 may include the same material as the passivation layer 162, and may be formed to be integrated with the passivation layer 162. For example, the passivation layer 162 may incompletely cover the second portion **148*b* of the third upper insulating layer 148**.

Figure 17:
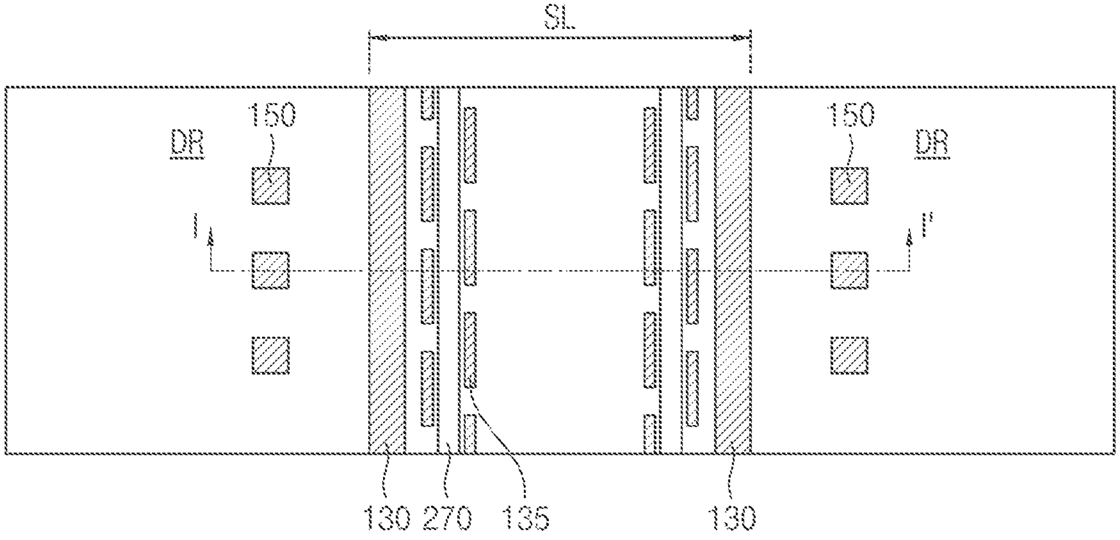

FIG. 17 corresponds to a plan view of the resultant structure shown in FIG. 16. Referring to FIG. 17, in plan view, a crack prevention structure 270 may be disposed between dam structures 135. In an embodiment, the crack prevention structure 270 may be disposed outside a guard ring 130 with reference to a device region DR, and may extend in a horizontal direction to completely surround the guard ring 130.

Figure 18:
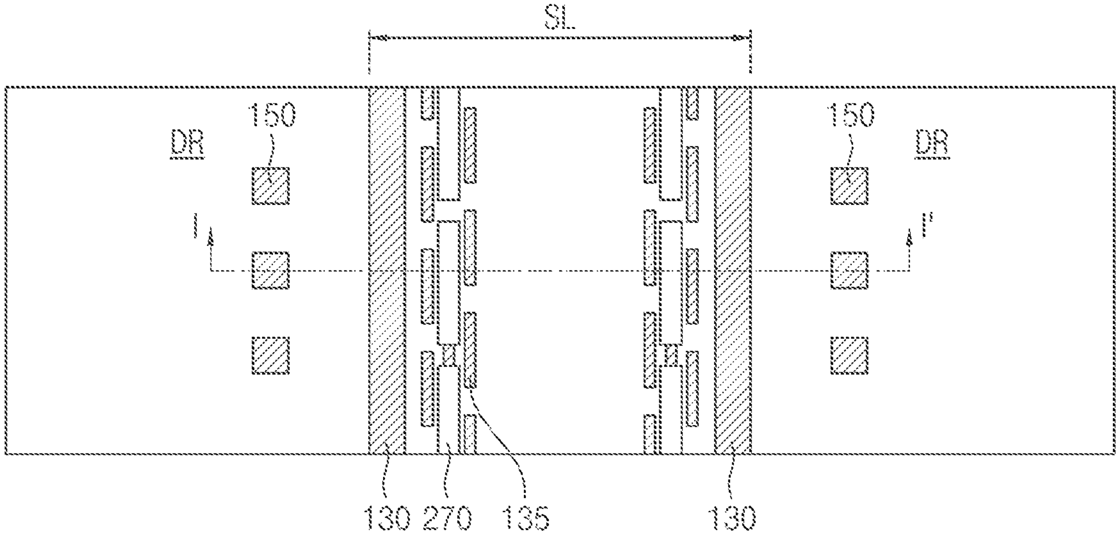

FIG. 18 shows a crack prevention structure 270 according to an embodiment. Referring to FIG. 18, in an embodiment, a plurality of crack prevention structures 270 may be disposed outside a guard ring 130 with reference to a device region DR. The plurality of crack prevention structures 270 may be spaced apart from one another in a direction parallel to an extension direction of the guard ring 130.

Figure 19:
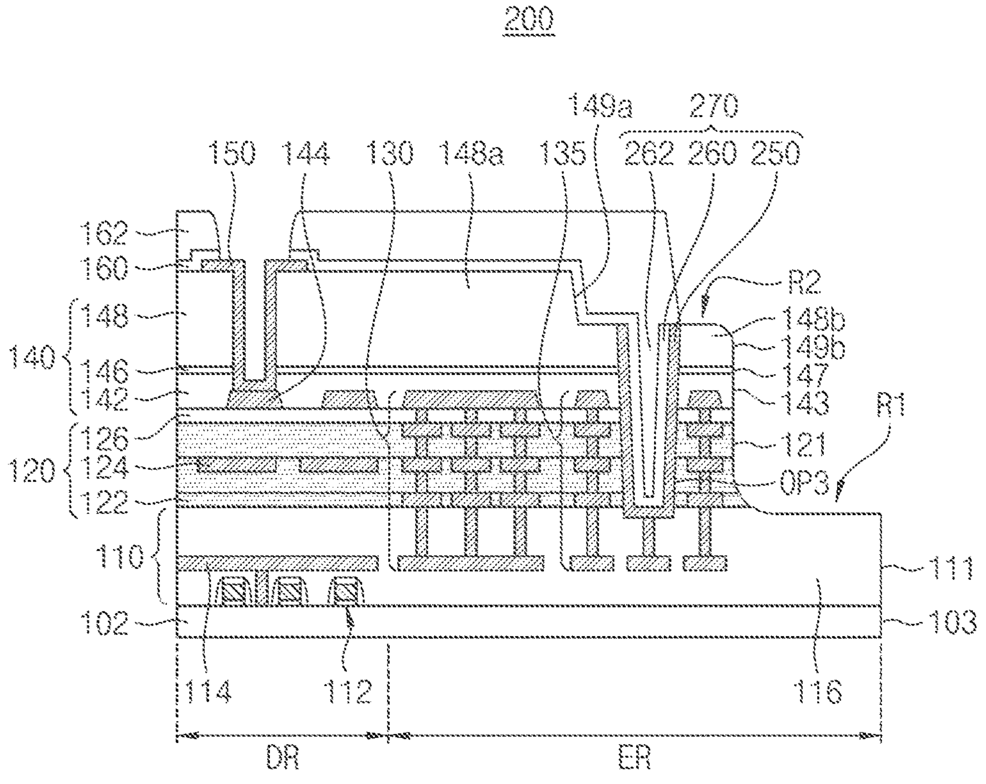

Referring to FIG. 19, the dicing process described with reference to FIG. 11 may be performed. A cutting region CR may be separated by the dicing process and, as such, a semiconductor chip 200 may be formed. The semiconductor chip 200 may include a configuration identical or similar to that of the semiconductor chip 100 of FIG. 11, except for a crack prevention structure 270. The semiconductor chip 200 may include a first recessed region R1 and a second recessed region R2 in an edge region ER. The first recessed region R1 may be identical or similar to the first recessed region R1 of the semiconductor chip 100 shown in FIG. 11. However, the second recessed region R2 of the semiconductor chip 200 may be partially covered by a protective layer 160 and a passivation layer 162. For example, a first side surface **149*a* of a third upper insulating layer 148 (or a first portion 148*a*) and a portion of an upper surface of the third upper insulating layer 148 (or a second portion 148*b*) may be covered by the protective layer 160 and the passivation layer 162. Although the crack prevention structure 270 is shown in FIG. 19 as extending from the upper surface of the second portion 148*b* to a device layer 110, the exemplary embodiments of the disclosure are not limited thereto. For example, in alternative embodiments, the crack prevention structure 270 may extend through the first portion 148*a* and a lower insulating structure 120. The crack prevention structure 270 may also extend from an upper surface of the first portion 148*a* to the device layer 110**.

Figure 20:
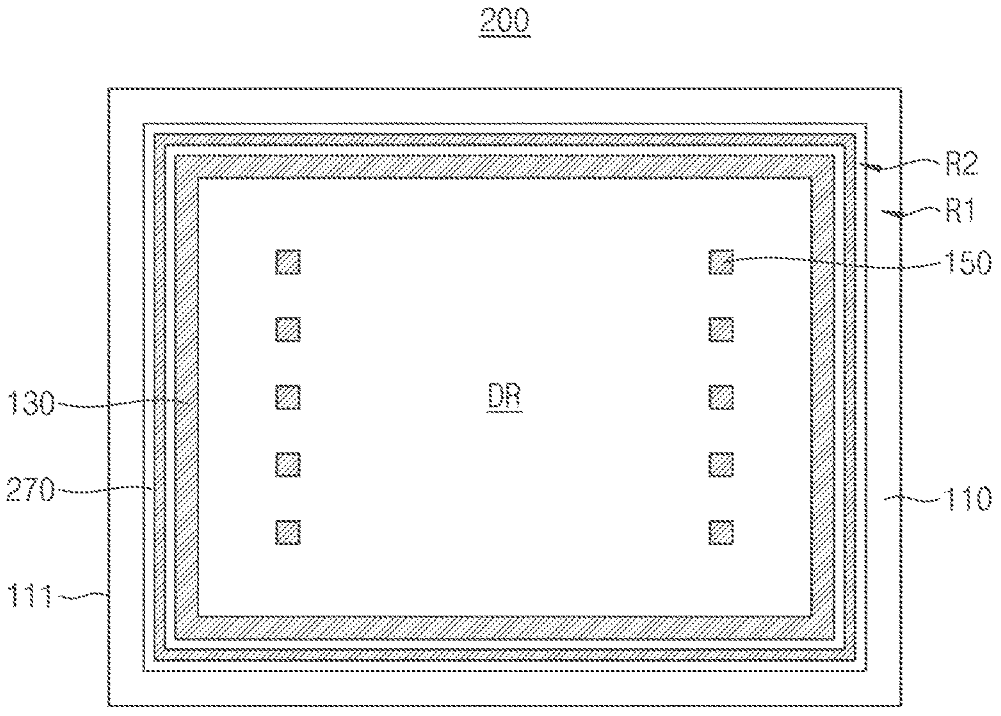
FIG. 20 is a plan view of a semiconductor chip according to an exemplary embodiment of the inventive concepts.

FIG. 20 is a plan view of a semiconductor chip according to an exemplary embodiment of the inventive concepts. Referring to FIG. 20, a guard ring 130 disposed in an edge region ER may extend in a horizontal direction to surround a device region DR. A crack prevention structure 270 may be disposed outside the guard ring 130 with reference to the device region DR, and may extend in the horizontal direction to surround the guard ring 130. The crack prevention structure 270 may overlap with a second recessed region R2.

Figure 21:
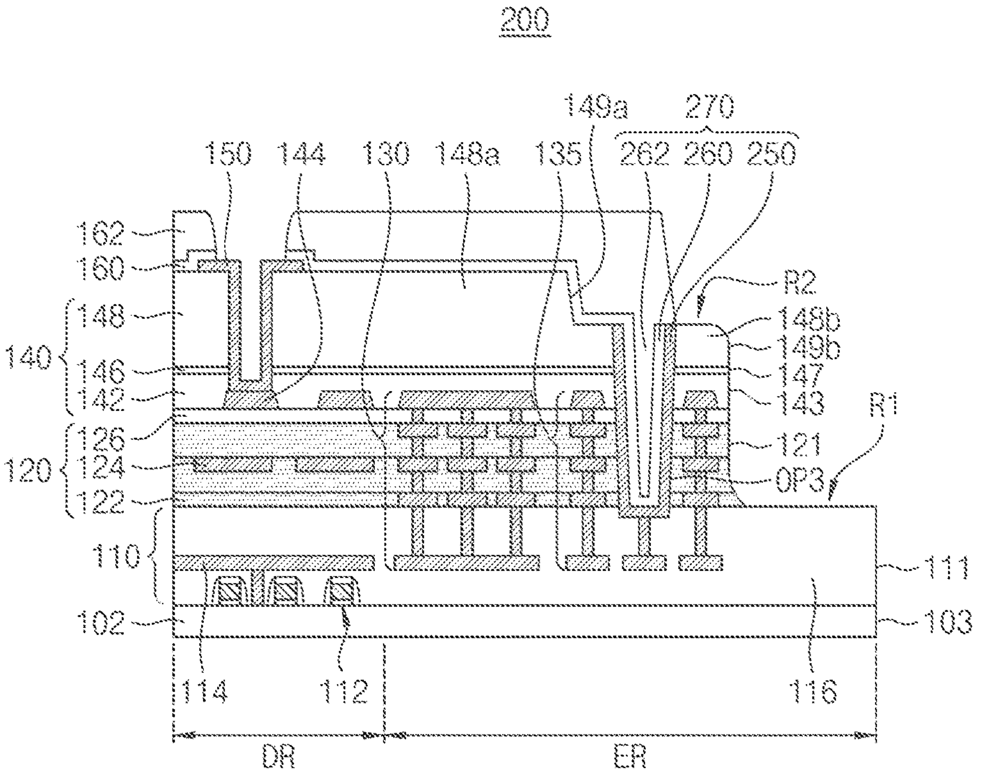
FIG. 21 is a cross-sectional view of a semiconductor chip according to an exemplary embodiment of the inventive concepts.

FIG. 21 is a cross-sectional view of a semiconductor chip according to an exemplary embodiment of the inventive concepts. A semiconductor chip 200 of FIG. 21 may have a similar structure as the semiconductor chip 200 shown in FIG. 19. In an embodiment, an upper surface of the lower interlayer insulating layer 116 exposed by a first recessed region R1 may be coplanar with a lower surface of a lower insulating structure 120. For example, the upper surface of the lower interlayer insulating layer 116 exposed by the first recessed region R1 may be coplanar with a lower surface of a lowermost lower insulating layer 122.

Figure 22:
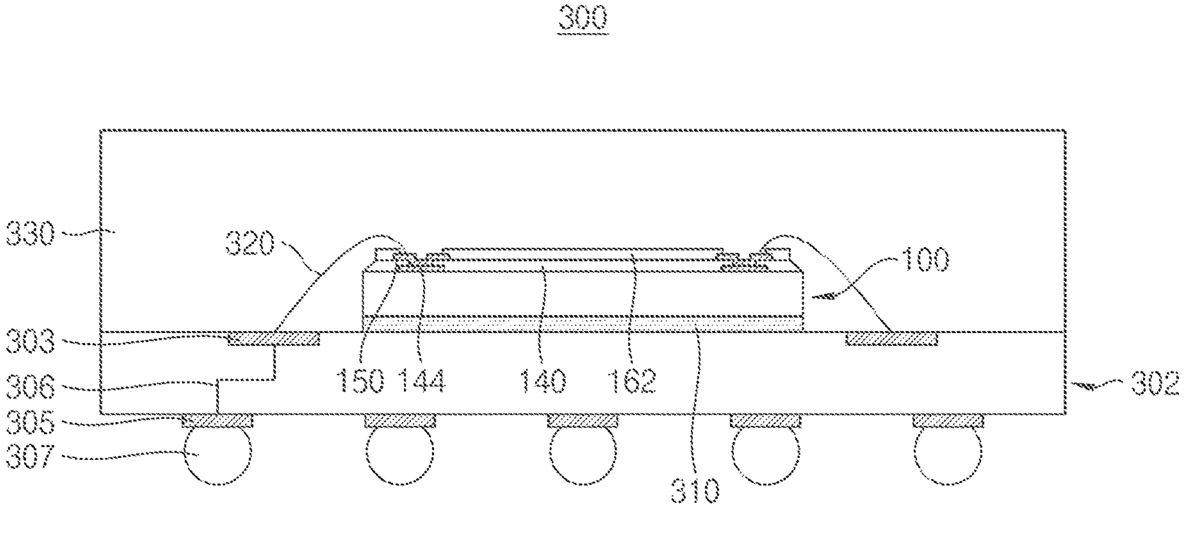
FIG. 22 is a cross-sectional view of a semiconductor package according to an exemplary embodiment of the inventive concepts.

FIG. 22 is a cross-sectional view of a semiconductor package 300 according to an exemplary embodiment of the inventive concepts. Referring to FIG. 22, the semiconductor package 300 may include a package substrate 302, a semiconductor chip 100, an adhesive member 310, a bonding wire 320, and an encapsulant 330.

The package substrate 302 may include upper pads 303, lower pads 305, an inner wiring 306, and an outer connection terminal 307. In an embodiment, the package substrate 302 may be a printed circuit board, and may include an insulating material such as phenolic resin, epoxy resin, prepreg, or the like. In another embodiment, the package substrate 302 may be a redistribution layer in which an insulating material and a conductive material are stacked. The upper pads 303 and the lower pads 305 may be formed by forming a metal layer on a base of the package substrate 302, and then patterning the metal layer. Although not shown, a solder resist layer may be disposed at top and lower surfaces of the package substrate 302, and may partially cover the upper pads 303 and the lower pads 305.

The upper pads 303 may be disposed at the upper surface of the package substrate 302, and may be electrically connected to the semiconductor chip 100. The lower pads 305 may be disposed at the lower surface of the package substrate 302, and each of the upper pads 303 may be electrically connected to the lower pad 305 corresponding thereto by the inner wiring 306. Outer connection terminals 307 may be disposed below the lower pads 305.

The lower pad 305 and the upper pads 303 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag). The inner wiring 306 may include copper (Cu), aluminum (Al), tungsten (W), nickel (Ni), titanium (Ti), titanium nitride (TiN), tantalum (Ta), tantalum nitride (TaN), gold (Au), or a combination thereof. The outer connection terminal 307 may be a solder bump.

The semiconductor chip 100 may be mounted on the package substrate 302. The semiconductor chip 100 may include a volatile memory chip such as DRAM or a non-volatile memory chip such as RRAM and flash memory. The semiconductor chip 100 may be mounted on the package substrate 302 via wire bonding.

The semiconductor chip 100 may include an upper insulating layer 140, a chip pad 144, a passivation layer 162 and a connection pad 150, which may be identical or similar to constituent elements of the semiconductor chip 100 shown in FIG. 11. The upper insulating layer 140 may be disposed at an upper portion of the semiconductor chip 100, and the passivation layer 162 may be disposed on the upper insulating layer 140 and may protect the upper insulating layer 140 from external physical impact.

The chip pad 144 may be buried in the upper insulating layer 140. The chip pad 144 may include, for example, a ground pad, a power pad, an AC pad, a data pad, and a DC pad, for example. The ground pad may be a pad for providing a reference potential for circuit operation of the semiconductor chip 100. The power pad may be a pad for supplying power for circuit operation. The AC pad may be a pad for supplying AC power to the semiconductor chip 100 or receiving a signal for execution of an AC test. The data pad may be a pad for input/output (I/O) of a logic signal or data. The DC pad may be a pad for measuring a potential level of a particular position of the semiconductor chip 100.

The connection pad 150 may be disposed on the chip pad 144, and may be buried in the passivation layer 162. A portion of the connection pad 150 may not be covered by the passivation layer 162, and may be directly connected to the bonding wire 320. The chip pad 144 may be electrically connected to the upper pad 303 disposed at the upper surface of the package substrate 302 by the connection pad 150 and the bonding wire 320. The chip pad 144 and the connection pad 150 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag).

The adhesive member 310 may be disposed between the package substrate 302 and the semiconductor chip 100. The adhesive member 310 may fix the semiconductor chip 100 to the upper surface of the package substrate 302. The adhesive member 310 may be a die attach film (DAF), without being limited thereto.

The encapsulant 330 may cover the package substrate 302, the semiconductor chip 100, and the bonding wire 320. For example, the encapsulant 330 may include a bisphenol-group epoxy resin, a polycyclic aromatic epoxy resin, an o-cresol novolac epoxy resin, a biphenyl-group epoxy resin, a naphthalene-group epoxy resin, or the like.

In accordance with the exemplary embodiments of the inventive concepts, a recessed region may completely cut a lower insulating structure in a cutting region, thereby exposing an upper surface of a device layer. Accordingly, it may be possible to prevent or reduce crack generation caused by lower insulating layers in a dicing process.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. An integrated circuit device, comprising:

a semiconductor substrate including a first device region, a second device region, and a scribe line region extending between the first and second device regions, said scribe line region comprising a first edge region adjacent the first device region, a second edge region adjacent the second device region and a cutting region extending between the first and second device regions;

a lower interlayer insulating layer on the first and second device regions and on the scribe line region;

a first multi-level guard ring at least partially surrounding the first device region, when viewed from a plan perspective;

a second multi-level guard ring at least partially surrounding the second device region, when viewed from the plan perspective; and an insulating structure including a lower insulating structure on the first and second device regions, and an upper insulating structure on the lower insulating structure, the lower insulating structure including lower insulating layers stacked on the lower interlayer insulating layer and having a recess therein, which extends between the first and second multi-level guard rings and exposes an upper surface of the lower interlayer insulating layer, wherein the recess exposing the upper surface of the lower interlayer insulating layer surrounds, in a plan view, the first device region, wherein the lower interlayer insulating layer comprises a first material having a first dielectric constant;

wherein the lower insulating structure of the insulating structure comprises a second material different than the first material, the second material having a second dielectric constant lower than the first dielectric constant; and wherein a first portion of the first multi-level guard ring extends lower than the recess within the lower interlayer insulating layer, and a second portion of the first multi-level guard ring extends within the insulating structure.

2. The device of claim 1, wherein the recess exposes a portion of the upper surface of the lower interlayer insulating layer extending opposite the cutting region.

3. The device of claim 1, wherein a third portion of the first multi-level guard ring extends on the upper surface of the lower interlayer insulating layer.

4. The device of claim 1, further comprising a first multi-level dam structure extending between the first multi-level guard ring and the recess in the insulating structure.

5. The device of claim 1, wherein a minimum width of the recess is greater than a width of the cutting region, when viewed from the plan perspective.

6. The device of claim 1, wherein the semiconductor substrate includes a structurally-weakened region therein, which is aligned to the cutting region.

7. The device of claim 6, wherein the structurally-weakened region is a laser-irradiated region.

8. The device of claim 1, wherein a first width of the recess in the upper insulating structure is greater than a second width of the recess in the lower insulating structure.

9. The device of claim 8, wherein the second width of the recess is greater than a width of the cutting region; and wherein a width of the scribe line region is greater than the first width of the recess.

10. The device of claim 8, wherein a spacing between the first and second multi-level guard rings is greater than the first width of the recess.

11. The device of claim 1, wherein the second portion of the first multi-level guard ring extends through the second material of the insulating structure.

12. The device of claim 1, wherein the second material of the insulating structure comprises a low-k dielectric.

13. The device of claim 1, wherein:

the first material of the lower interlayer insulating layer comprises one or more of silicon oxide, silicon nitride, or silicon oxynitride;

wherein the second material of the insulating structure comprises silicon oxide doped with one or more of an impurity or an organic polymer.

14. An integrated circuit device, comprising:

a semiconductor substrate including a device region, and an edge region surrounding the device region;

a device layer extending on the semiconductor substrate, the device layer including a lower interlayer insulating layer covering the semiconductor substrate;

a multi-level guard ring at least partially surrounding the device region, when viewed from a plan perspective; and an insulating structure including a lower insulating structure on the device layer, and an upper insulating structure on the lower insulating structure, the lower insulating structure including lower insulating layers stacked on the lower interlayer insulating layer;

wherein the insulating structure includes a first recessed region, which is formed at an edge of the device layer in the edge region and exposes an upper surface of the lower interlayer insulating layer and side surfaces of the lower insulating layers, the first recessed region extending into the lower interlayer insulating layer in a vertical direction, wherein the first recessed region exposing the upper surface of the lower interlayer insulating layer surrounds, in a plan view, the device region, wherein the lower interlayer insulating layer comprises a first material having a first dielectric constant;

wherein the lower insulating structure of the insulating structure comprises a second material different than the first material, the second material having a second dielectric constant lower than the first dielectric constant.

15. The device of claim 14, wherein a first portion of the multi-level guard ring extends lower than the first recessed region within the lower interlayer insulating layer; and a second portion of the multi-level guard ring extends within the lower insulating structure and through the second material of the lower insulating structure.

16. The device of claim 15, wherein a third portion of the multi-level guard ring extends on the upper surface of the lower interlayer insulating layer.

17. The device of claim 14, wherein the upper insulating structure includes a second recessed region formed over the first recessed region and nearer to the device region than the first recessed region.

18. The device of claim 17, wherein a first width of the second recessed region in the upper insulating structure is greater than a second width of the first recessed region in the lower insulating structure.

19. The device of claim 14, further comprising a first multi-level dam structure extending between the multi-level guard ring and the first recessed region of the insulating structure.

20. The device of claim 14, wherein a side surface of a lowermost one of the lower insulating layers is rounded.

* * * * *